United States Patent
Coushaine et al.

(10) Patent No.: US 7,090,386 B2
(45) Date of Patent: Aug. 15, 2006

(54) HIGH DENSITY LED ARRAY

(75) Inventors: Charles M. Coushaine, Rindge, NH (US); Michael Tucker, Henniker, NH (US); Thomas Tessnow, Weare, NH (US); Ralph J. Johnson, Bedford, NH (US); Steven C. Sidwell, Hopkington, NH (US)

(73) Assignee: Osram Sylvania Inc., Danvers, MA (US)

( * ) Notice: Subject to any disclaimer, the term of this patent is extended or adjusted under 35 U.S.C. 154(b) by 78 days.

(21) Appl. No.: 10/984,457

(22) Filed: Nov. 9, 2004

(65) Prior Publication Data

US 2005/0281025 A1 Dec. 22, 2005

Related U.S. Application Data

(60) Provisional application No. 60/580,526, filed on Jun. 17, 2004.

(51) Int. Cl.
*F21V 7/04* (2006.01)

(52) U.S. Cl. .................. 362/555; 362/556; 362/581

(58) Field of Classification Search ........... 362/555, 362/554, 581, 545, 511; 385/115–121
See application file for complete search history.

(56) References Cited

U.S. PATENT DOCUMENTS

| | | | |
|---|---|---|---|
| 3,744,048 A * | 7/1973 | Treichel | ............ 340/326 |
| 4,280,122 A * | 7/1981 | McKinley et al. | ..... 340/815.43 |
| 4,525,711 A * | 6/1985 | Gery | ............ 340/815.42 |
| 5,293,437 A | 3/1994 | Nixon | |
| 5,781,223 A * | 7/1998 | Sutoh et al. | ............ 347/238 |
| 5,911,024 A | 6/1999 | Wallace | |
| 6,595,674 B1 | 7/2003 | Yoneda | |
| 6,628,867 B1 | 9/2003 | Solntsev | |
| 6,880,276 B1 * | 4/2005 | Strein et al. | ........... 40/442 |
| 2003/0219207 A1 | 11/2003 | Guy | |
| 2004/0141336 A1 | 7/2004 | West | |
| 2004/0146256 A1 | 7/2004 | Solntsev | |

* cited by examiner

*Primary Examiner*—Renee Luebke
*Assistant Examiner*—Gunyoung T. Lee
(74) *Attorney, Agent, or Firm*—William E. Meyer

(57) ABSTRACT

A high-density LED array (10) capable of presenting a density of X LEDs/unit area has a first printed circuit board (12) having X/2 LEDs/area and X/2 apertures arrayed therewith. A second printed circuit board (22) is spaced from the first printed circuit board (12) and has X/2 LEDs 28/unit area. The LEDs (28) on the second printed circuit board are aligned with the apertures (20) in the first printed circuit board. Each of the LEDs (28) on the second printed circuit board (22) has an optical fiber (30) associated therewith and each of the light guides (30) extends through one of the apterures (20). Each of the mounted LEDs on the first printed circuit board can have an optical fiber associated therewith and the light guides can be bundled to direct light to a remote source.

3 Claims, 1 Drawing Sheet

HIGH DENSITY LED ARRAY

CROSS-REFERENCE TO RELATED APPLICATIONS

The Applicants hereby claim the benefit of their provisional application, Ser. No. 60/580,526 filed Jun. 17, 2004 "Light Emitting Diode Lamp with Clustered Light-Pipes."

TECHNICAL FIELD

This invention relates to light sources and more particularly to light sources employing light emitting diodes (LED or LEDs). Still more particularly it relates to a lamp having a high density LED array.

BACKGROUND ART

LED lamps have been achieving acceptance as replacements for the more common incandescent types of lamps because of their long life and reasonable power requirements. These uses are particulary present in the automotive industry where lamps employing LEDs have been used as taillights and as stoplights, such as the required center high mount stoplight (CHMSL). However, even though the LEDs are solid state devices whose light output has increased over time, when driven at the power requirements necessary for some application, such as the aforementioned auto uses, the heat generated by the lamps becomes a problem requiring heat shields or heat dissipating additions, which increase the cost of the lamps. As the density of the LED sources increases as a function of increasing the light output of a lamp, for example, to use LEDs in headlight applications, the heat generated becomes a significant problem. Also, stacking density of the LEDs becomes a physical problem in and of itself.

DISCLOSURE OF INVENTION

It is, therefore, an object of the invention to obviate the disadvantages of the prior art.

It is another object of the invention to increase the density of LEDs.

These objects are accomplished, in one aspect of the invention, by the provision of a high-density LED array capable of presenting a density of X LEDs/unit area that comprises a first printed circuit board having X/2 LEDs/unit area and X/2/unit area apertures arrayed therewith; and a second printed circuit board spaced from said first printed circuit board and having X/2 LEDs/unit area, said LEDs on said second printed circuit board being aligned with said apertures in said first printed circuit board.

The use of multiple stacked boards each with only a fraction of the total number of LEDs allows for an array that presents a much greater density of light points than can be achieved with the use of a single board.

In another embodiment of the invention both sets of LEDs can be associated with light guides, which can be directed to a remote location to provide special effects.

The light guides can be plastic or glass or they can comprise optical fibers.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figures 1A, 1B:
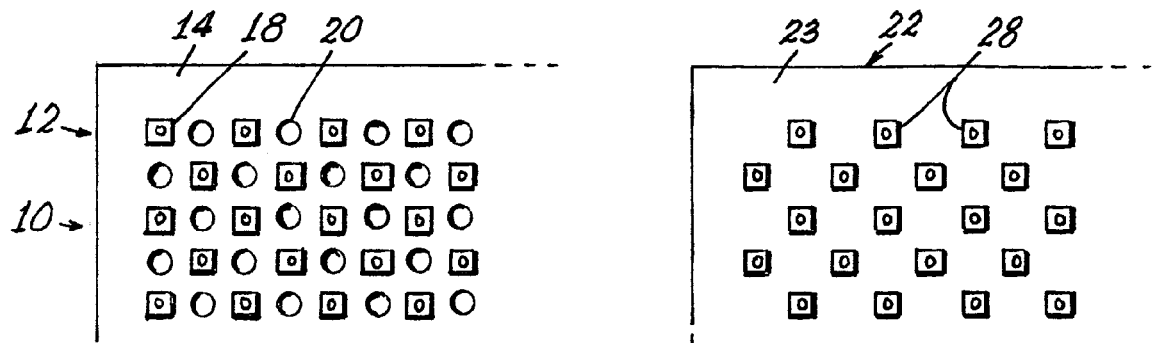
FIG. 1a is a diagrammatic plan view of a first printed circuit board for use with the invention.
FIG. 1b is a similar view of a second printed circuit board.

Referring now to the drawings with greater particularity, there is shown in FIG. 1a a high-density LED array 10 capable of presenting a density of X LEDs/unit area comprising a first printed circuit board 12 having a first surface 14 with X/2 LEDs 18/unit area and X/2 apertures 20 arrayed therewith.

Figure 2:
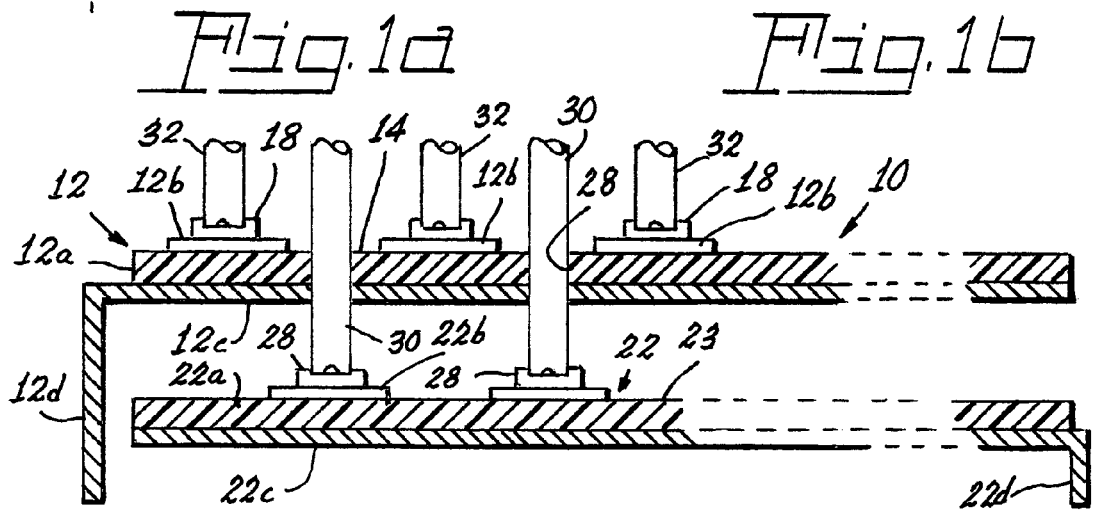
FIG. 2 is a diagrammatic sectional elevational view of an LED lamp in accordance with an aspect of the invention.

The printed circuit board 12 can be formed of two layers (see FIG. 2), a first layer 12a comprising a thermally conductive, electrically insulating material having conductive traces 12b thereon, bonded to a metal plate 12c, which functions as a heatsink. The metal plate 12c can have a depending leg 12d to further draw heat away from the operating LEDs.

A second printed circuit board 22 has a surface 23 and can also be formed in two layers, a first layer 22a comprising a thermally conductive, electrically insulating material having conductive traces 22b thereon, bonded to a metal plate 22c which functions as a heatsink, and can further be provided with a depending leg 22d. The second PCB 22 is spaced from the the first PCB 12 and has X/2 LEDs 28/unit area. The LEDs 28 on the second printed circuit board are aligned with the apertures 20 in the first printed circuit board 14.

The PCBs 12 and 22 are provided with a pattern of LEDs and apertures (PCB 12) or just LEDs (PCB 22). As shown the pattern is grid-like, comparable to a checkerboard pattern, and PCB 12 has alternate LEDs and apertures, while PCB 22 has only LEDs. Other patterns are of course possible, depending on the end use of the lamp with which the LED array will be used.

Each of the LEDs 28 on the second printed circuit board 22 has a light guide 30 associated therewith and each of the light guides 30 extends through one of the apertures 20. Thus, all of the illumination from the LEDs 18 and the LEDs 28 appears to be in the same plane.

Figure 3:
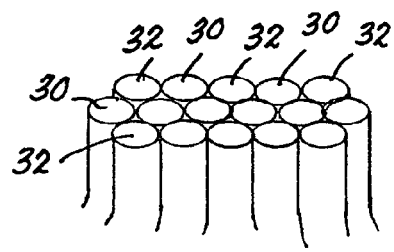
FIG. 3 is a perspective view of one version of an optical fiber bundle.

In an alternate embodiment of the invention, the LEDs 18 can be provided with light guides 32 and all of the guides 30 and 32 can be bundled and directed to a remote location, in a group as shown diagrammatically in FIG. 3, or in any other desired configuration.

While the array shown in the drawings pictures two PCBs, other numbers of PCBs can be stacked in this fashion, for example, to present different colored light emittings LEDs.

Splitting the LEDs on to multiple circuit boards separates the heat and allows a tighter cluster of light guides with fewer bends: therefore, greater optical efficiency results.

While there have been shown what are at present considered to be the preferred embodiments of the invention, it will be apparent to those skilled in the art that various changes and modifications can be made herein without departing from the scope of the invention as defined by the appended claims.

What is claimed is:

1. A high-density LED array comprising:

first printed circuit board;

a pattern on a surface of said first printed circuit board, said pattern comprising an alternation of mounted LEDs and adjacent apertures through said printed circuit board;

second printed circuit board spaced from said first printed circuit board;

a pattern on a surface of said second printed circuit board, said pattern comprising LEDs mounted on said second circuit board and perpendicularly aligned with said apertures in said first printed circuit board; and an optical fiber associated with each of said second board LEDs, each of said optical fibers projecting straight through one of said apertures in said first printed circuit board.

2. The high density LED array of claim 1 wherein each of said mounted LEDs said first printed circuit board has an optical fiber association therewith.

3. The high density LED array of claim 2 wherein said optical fibers from said first and second printed circuit boards are bundled together to form a single plane for the emission of light from said LED.

* * * * *